(12) United States Patent
Ake et al.

(10) Patent No.: US 9,473,083 B2
(45) Date of Patent: Oct. 18, 2016

(54) APPARATUS AND METHODS FOR RADIO FREQUENCY AMPLIFIERS

(71) Applicant: Skyworks Solutions, Inc., Woburn, MA (US)

(72) Inventors: Alan William Ake, Greensboro, NC (US); David C. Dening, Stokesdale, NC (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 95 days.

(21) Appl. No.: 14/457,965

(22) Filed: Aug. 12, 2014

(65) Prior Publication Data

US 2014/0347136 A1  Nov. 27, 2014

Related U.S. Application Data

(62) Division of application No. 13/462,517, filed on May 2, 2012, now Pat. No. 8,836,433.

(60) Provisional application No. 61/484,581, filed on May 10, 2011.

(51) Int. Cl.
*H03G 3/30* (2006.01)
*H03F 3/195* (2006.01)
(Continued)

(52) U.S. Cl.
CPC ............... *H03F 3/195* (2013.01); *H01L 23/66* (2013.01); *H01L 24/06* (2013.01); *H03F 1/32* (2013.01); *H03F 1/3205* (2013.01); *H03F 3/191* (2013.01); *H03F 3/193* (2013.01); *H03F 3/211* (2013.01); *H03F 3/245* (2013.01); *H03F 3/3435* (2013.01);
(Continued)

(58) Field of Classification Search
CPC ............ H01L 2924/1305; H01L 2924/13091; H01L 2224/48227; H01L 2924/1306; H01L 2924/13062; H01L 2924/30107; H01L 23/66; H01L 27/0605; H01L 24/06; H01L 2223/6611; H01L 2223/6616; H03F 3/191; H03F 2200/294; H03F 2200/451; H03F 1/08; H03F 3/195; H03F 1/3205; H03F 3/193; H03F 3/211; H03F 3/3435; H03F 1/32
USPC ................................................. 330/285, 296
See application file for complete search history.

(56) References Cited

U.S. PATENT DOCUMENTS 7,142,058 B2 * 11/2006 Bokatius ................... H03F 1/30
330/289
7,439,805 B1 * 10/2008 Kobayashi .............. H01L 28/10
257/E21.022

(Continued)

*Primary Examiner* — Khanh V Nguyen
(74) *Attorney, Agent, or Firm* — Knobbe Martens Olson & Bear LLP

(57) ABSTRACT

Apparatus and methods for radio frequency (RF) amplifiers are disclosed herein. In certain implementations, a packaged RF amplifier includes a first bipolar transistor including a base electrically connected to an RF input pin and a collector electrically connected to an RF output pin, and a second bipolar transistor including a base electrically connected to an emitter of the first bipolar transistor and a collector electrically connected to the RF output pin. The packaged RF amplifier further includes a first bias circuit electrically connected between the base of the first bipolar transistor and the RF output pin, a second bias circuit electrically connected between the base of the first bipolar transistor and a power low pin, an inductor implemented at least partly by a bond wire, and a third bias circuit electrically connected in series with the inductor between the base of the second bipolar transistor and the power low pin.

20 Claims, 8 Drawing Sheets

(51) Int. Cl.
*H01L 23/66* (2006.01)
*H03F 1/32* (2006.01)
*H03F 3/191* (2006.01)
*H03F 3/193* (2006.01)
*H03F 3/21* (2006.01)
*H03F 3/24* (2006.01)
*H03F 3/343* (2006.01)
*H01L 23/00* (2006.01)
*H03F 1/30* (2006.01)

(52) U.S. Cl.
CPC .. *H01L 2223/665* (2013.01); *H01L 2223/6611* (2013.01); *H01L 2223/6616* (2013.01); *H01L 2223/6644* (2013.01); *H01L 2224/48091* (2013.01); *H01L 2224/48247* (2013.01); *H01L 2224/48257* (2013.01); *H01L 2224/49113* (2013.01); *H01L 2924/10253* (2013.01); *H01L 2924/1305* (2013.01); *H01L 2924/1306* (2013.01); *H01L 2924/13062* (2013.01); *H01L 2924/13063* (2013.01); *H01L 2924/13091* (2013.01); *H01L 2924/3011* (2013.01); *H01L 2924/30107* (2013.01); *H03F 1/302* (2013.01); *H03F 2200/451* (2013.01); *H03F 2200/492* (2013.01); *H03F 2200/93* (2013.01); *H03G 3/30* (2013.01)

(56) References Cited

U.S. PATENT DOCUMENTS

| | | | |
|---|---|---|---|
| 7,619,482 B1 * | 11/2009 | Kobayashi | H03F 3/193 330/310 |
| 8,248,166 B2 * | 8/2012 | Kobayashi | H03F 1/0261 330/310 |
| 8,836,433 B2 | 9/2014 | Dening et al. | |
| 2011/0186992 A1 | 8/2011 | Wu et al. | |

* cited by examiner

APPARATUS AND METHODS FOR RADIO FREQUENCY AMPLIFIERS

CROSS-REFERENCE TO RELATED APPLICATIONS

The present application is a divisional of U.S. application Ser. No. 13/462,517, filed May 2, 2012, titled "APPARATUS AND METHODS FOR ELECTRONIC AMPLIFICATION," which claims the benefit of priority under 35 U.S.C. §119(e) of U.S. Provisional Patent Application No. 61/484,581, filed May 10, 2011 entitled "APPARATUS AND METHODS FOR ELECTRONIC AMPLIFICATION", which is herein incorporated by reference in its entirety.

BACKGROUND

1. Field

Embodiments of the invention relate to electronic systems, and in particular, to radio frequency (RF) electronics.

2. Description of the Related Technology

RF amplifiers can be used to boost the amplitude of a relatively weak RF signal. Thereafter, the boosted RF signal can be used for a variety of purposes, including, for example, driving an antenna, a switch, a mixer and/or a filter in an RF system.

RF amplifiers can be included in base stations to amplify signals of a wide range of frequencies. RF amplifiers can also be included in other RF electronic systems as well, such as wireless or mobile devices. The third order distortion of a RF amplifier can be an important consideration. For example, reducing the third order distortion of a RF amplifier can improve the amplifier's linearity by reducing the magnitude of spurs and/or other unwanted harmonics at the output of the RF amplifier.

There is a need for improved RF amplifier systems. Furthermore, there is a need for RF amplifiers having improved third order distortion.

SUMMARY

In certain embodiments, the present disclosure relates to a packaged integrated circuit including a package substrate associated with a conductor configured to receive a power low voltage, a die disposed on the conductor, and a bond wire. The die includes a first transistor configured to amplify a radio frequency (RF) input signal to generate an amplified RF signal, a second transistor configured to amplify the amplified signal to generate a RF output signal, a through wafer via configured to provide the power low voltage from the conductor to the second transistor, and a power low pad. The bond wire is electrically connected between the conductor and the power low pad, and the bond wire is configured to provide the power low voltage to the first transistor.

In various embodiments, the bond wire is configured to pass over more than half of a length of the die to increase the inductance between the first transistor and the power low voltage.

In a number of embodiments, a length of the bond wire is configured to control a value of a third order intercept point (IP3) associated with the first and second transistors.

In accordance with several embodiments, the die further includes a spiral inductor disposed in an electrical path between the power low pad and the first transistor.

In some embodiments, the first and second transistors are bipolar transistors and an emitter of the first transistor is electrically connected to a base of the second transistor.

According to a number of embodiments, the packaged integrated circuit further includes a first biasing circuit electrically connected between a base of the first transistor and a collector of the first transistor and a second biasing circuit electrically connected between the base of the first transistor and the through wafer via.

In various embodiments, the packaged integrated circuit further includes a third biasing circuit electrically connected between the emitter of the first transistor and the power low pad and a fourth biasing circuit electrically connected between an emitter of the second transistor and the through wafer via.

In some embodiments, a collector of the second transistor is electrically connected to the collector of the first bipolar transistor.

In a number of embodiments, the first bias circuit includes a first resistor and the second bias circuit includes a second resistor electrically connected in series with a first diode and a second diode.

In accordance with several embodiments, the third bias circuit includes a third resistor electrically connected in series with a third diode and the fourth bias circuit includes a fourth resistor.

In various embodiments, the packaged integrated circuit further includes a DC blocking capacitor electrically connected between the emitter of the first bipolar transistor and a base of the second bipolar transistor.

In some embodiments, the first and second transistors are field effect transistors and a source of the first transistor is electrically connected to a gate of the second transistor.

In certain embodiments, an electronic amplification circuit includes a first bipolar transistor, a second bipolar transistor, a first bias circuit, a second bias circuit, an inductor, a third bias circuit, and a fourth bias circuit. The first bipolar transistor includes an emitter, a base, and a collector, and the second bipolar transistor includes an emitter, a base, and a collector. The collector of the second bipolar transistor is electrically connected to the collector of the first bipolar transistor, and the base of the second bipolar transistor is electrically connected to the emitter of the first bipolar transistor. The first bias circuit has a first end electrically connected to the collector of the first bipolar transistor and a second end electrically connected to the base of the first bipolar transistor. The second bias circuit has a first end electrically connected to the base of the first bipolar transistor and a second end electrically connected to a power low node. The inductor has a first end and a second end, the first end electrically connected to the power low node. The third bias circuit has a first end electrically connected to the emitter of the first bipolar transistor and a second end electrically connected to the second end of the inductor. The fourth bias circuit has a first end electrically connected to the emitter of the second bipolar transistor and a second end electrically connected to the power low node.

In various embodiments, the inductor has an inductance ranging between about 0.3 nH and about 4 nH.

In a number of embodiments, the inductor is formed at least partly using a bond wire.

In accordance with several embodiments, the first bias circuit includes a resistor having a first end electrically connected to the collector of the first bipolar transistor and a second end electrically connected to the base of the first bipolar transistor, and the second bias circuit includes a resistor, a first diode and a second diode electrically connected in series between the base of the first bipolar transistor and the power low node.

In some embodiments, the third bias circuit includes a resistor and a diode electrically connected in series between the emitter of the first bipolar transistor and the second end of the inductor, and the fourth bias circuit includes a resistor having a first end electrically connected to the emitter of the second bipolar transistor and a second end electrically connected to the power low node.

According to a number of embodiments, the first and second bipolar transistors are each NPN bipolar transistors.

In a number of embodiments, the electronic amplification circuit further includes a capacitor electrically connected between the emitter of the first bipolar transistor and a base of the second bipolar transistor.

In certain embodiments, the present disclosure relates to an electronic amplification circuit including a first field effect transistor (FET), a second FET, a first bias circuit, a second bias circuit, an inductor, a third bias circuit, and a fourth bias circuit. The first FET includes a source, a gate, and a drain, and the second FET includes a source, a gate, and a drain. The drain of the second FET is electrically connected to the drain of the first FET, and the gate of the second FET is electrically connected to the source of the first FET. The first bias circuit has a first end electrically connected to the drain of the first FET and a second end electrically connected to the gate of the first FET. The second bias circuit has a first end electrically connected to the gate of the first FET and a second end electrically connected to a power low node. The inductor has a first end and a second end, the first end electrically connected to the power low node. The third bias circuit has a first end electrically connected to the source of the first FET and a second end electrically connected to the second end of the inductor. The fourth bias circuit has a first end electrically connected to the source of the second FET and a second end electrically connected to the power low node.

In various embodiments, the inductor has an inductance ranging between about 0.3 nH and about 4 nH.

In a number of embodiments, the inductor is formed at least partly using a bond wire.

In accordance with several embodiments, the first bias circuit includes a resistor having a first end electrically connected to the source of the first FET and a second end electrically connected to the gate of the first FET, and the second bias circuit includes a resistor, a first diode and a second diode electrically connected in series between the gate of the first FET and the power low node.

In some embodiments, the third bias circuit includes a resistor and a diode electrically connected in series between the source of the first FET and the second end of the inductor, and the fourth bias circuit includes a resistor having a first end electrically connected to the source of the second FET and a second end electrically connected to the power low node.

In certain embodiments, the present disclosure relates to a packaged integrated circuit including a package substrate associated with a conductor configured to receive a power low voltage, a die disposed on the conductor, and a bond wire. The die includes a first amplifier transistor, a second amplifier transistor, a power low pad, and a through wafer via configured to provide the power low voltage from the conductor to the second amplifier transistor. The bond wire is electrically connected between the conductor and the power low pad, and the bond wire configured to provide the power low voltage to the first amplifier transistor.

In various embodiments, the bond wire is configured to pass over more than half of a length of the die to increase the inductance between the first amplifier transistor and the power low voltage.

In a number of embodiments, a length of the bond wire is configured to control a value of a third order intercept point (IP3) associated with the first and second amplifier transistors.

In accordance with several embodiments, the first amplifier transistor is configured to amplify a radio frequency (RF) input signal to generate an amplified RF signal and the second amplifier transistor is configured to amplify the amplified RF signal to generate a RF output signal.

DETAILED DESCRIPTION OF EMBODIMENTS

The headings provided herein, if any, are for convenience only and do not necessarily affect the scope or meaning of the claimed invention.

Apparatus and methods for electronic amplification are disclosed herein. In certain implementations, an amplifier is provided for amplifying a RF signal, and the amplifier includes a first transistor and a second transistor electrically connected in a Darlington configuration. The first and second transistors can be, for example, bipolar or field effect transistors and the first transistor can amplify an input signal and provide the amplified input signal to the second transistor. The first and second transistors are electrically connected to a power low node such as a ground node through first and second bias circuits, respectively. In certain implementations, the first transistor includes an inductor disposed in the path from the first transistor to the power low voltage. By including the inductor in the path from the first transistor to the ground node, the third order distortion of the amplifier can be improved.

Overview of Radio Frequency Systems

Figure 1:
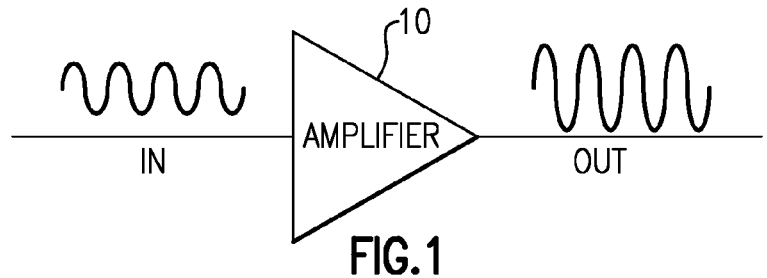
FIG. 1 is a schematic diagram of an example of a radio frequency (RF) amplifier.

FIG. 1 is a schematic diagram of an example of a radio frequency (RF) amplifier 10. The RF amplifier 10 can be configured to amplify an RF signal IN to generate an amplified RF signal OUT.

Figure 2:
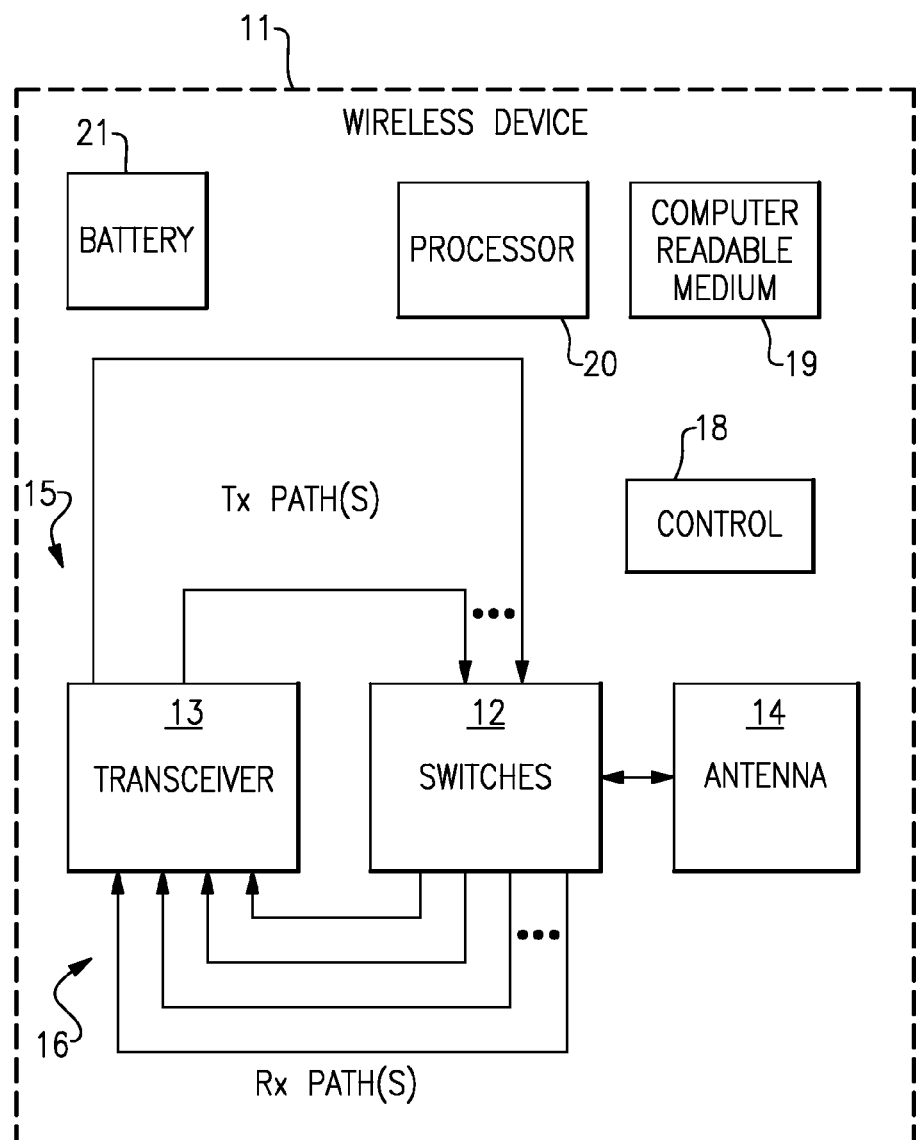
FIG. 2 is a schematic block diagram of an example wireless device that can include one or more of the RF amplifiers of FIG. 1.

FIG. 2 is a schematic block diagram of an example wireless or mobile device 11 that can include one or more of the RF amplifiers 10 of FIG. 1. The wireless device 11 can include RF amplifiers implementing one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 radio frequency spectrum bands.

One or more RF amplifiers of the present disclosure can be used to amplify signals within a mobile device implementing the foregoing example modes and/or bands, and in other communication standards. For example, 3G, 4G, LTE, and Advanced LTE are non-limiting examples of such standards.

In certain embodiments, the wireless device 11 can include switches 12, a transceiver component 13, an antenna 14, a control component 18, a computer readable medium 19, a processor 20, and a battery 21.

The transceiver component 13 can generate RF signals for transmission via the antenna 14. Furthermore, the transceiver component 13 can receive incoming RF signals from the antenna 14. It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two different paths shown can represent paths associated with different power outputs (e.g., low power output and high power output), and/or paths associated with different bands. Although the wireless device 11 is illustrated as including two transmission paths 15, the wireless device 11 can be adapted to include more or fewer transmission paths.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although the wireless device 11 is illustrated as including four receiving paths 16, the wireless device 11 can be adapted to include more or fewer receiving paths.

To facilitate switching between receive and transmit paths, the switches 12 can be configured to electrically connect the antenna 14 to a selected transmit or receive path. Thus, the switches 12 can provide a number of switching functionalities associated with operation of the wireless device 11. The switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12 and/or other operating component(s). Non-limiting examples of the control component 18 are described herein in greater detail.

In certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus.

The battery 21 can be any suitable battery for use in the wireless device 11, including, for example, a lithium-ion battery.

The amplifiers described herein can be used in the wireless device 11 of FIG. 2. For example, one or more RF amplifiers can be used, for example, for amplification of signals in the transceiver component 13 and/or to amplify signals received from or provided to the switches 12.

Figure 3:
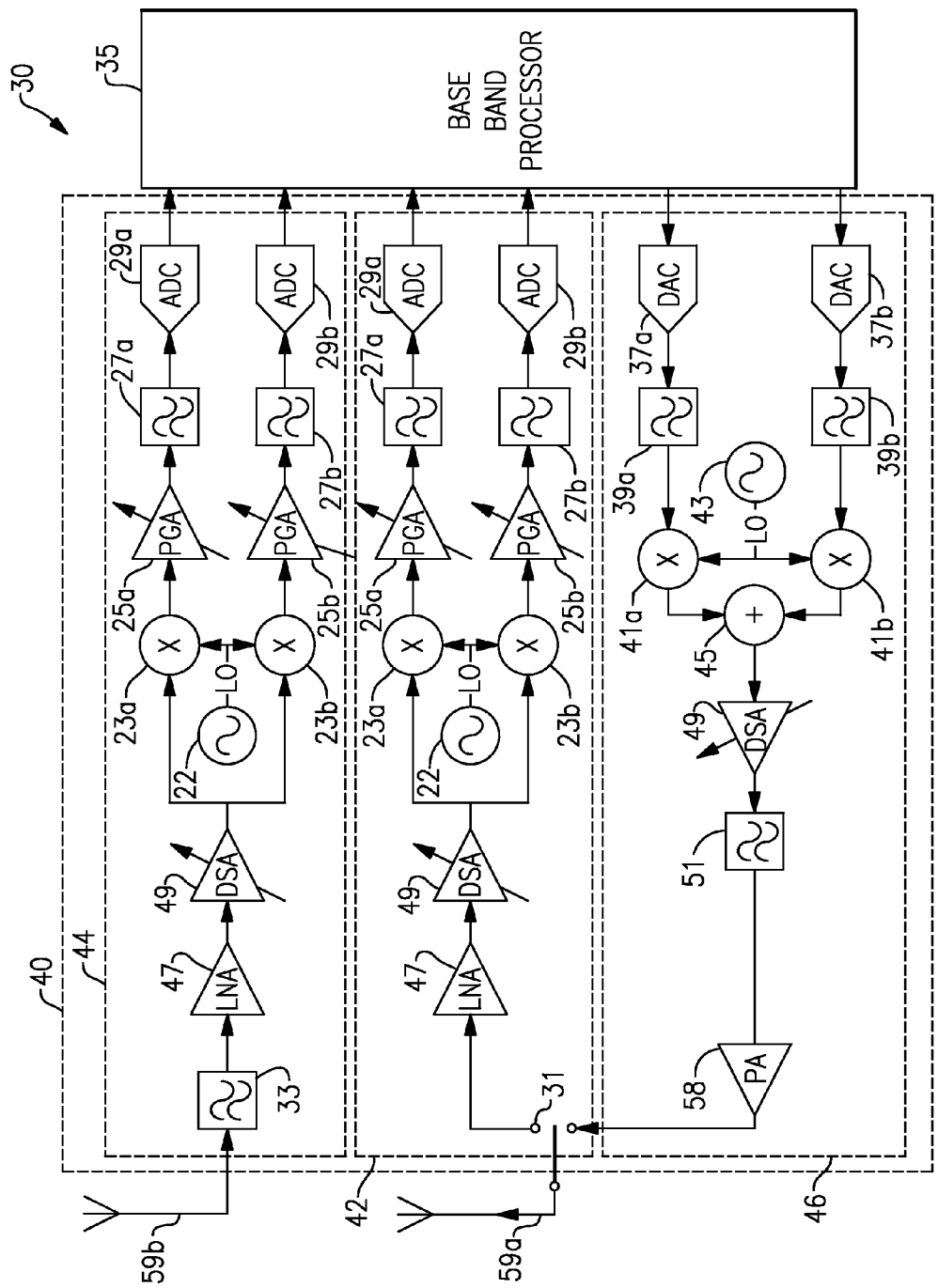
FIG. 3 is a schematic block diagram of an example electronic system that can include one or more of the RF amplifiers of FIG. 1.

FIG. 3 is a schematic block diagram of an example electronic system 30 that can include one or more of the RF amplifiers 10 of FIG. 1. The electronic system 30 can be, for example, a base station. The electronic system 30 can include one or more RF amplifiers implementing one or more features of the present disclosure. The illustrated electronic system 30 includes first and second antennas 59*a*, 59*b*, a base band processor 35, and a transceiver component 40.

The electronic system 30 can be used for transmitting and/or receiving RF signals using a variety of communication standards, including, for example, Global System for Mobile Communications (GSM), Code Division Multiple Access (CDMA), wideband CDMA (W-CDMA), Long Term Evolution (LTE), 3G, 3GPP, 4G, Enhanced Data Rates for GSM Evolution (EDGE), wireless local loop (WLL), and/or Worldwide Interoperability for Microwave Access (WiMax), as well as other proprietary and non-proprietary communications standards.

The electronic system 30 can include the transceiver component 40 for generating RF signals for transmission using the first antenna 59*a* and for receiving RF signals from the first and second antennas 59*a*, 59*b*. The illustrated transceiver component 40 includes first and second receive paths 42, 44 and a transmit path 46. Although one implementation of the electronic system 30 is illustrated in FIG. 3, the electronic system 30 can be modified in any suitable manner. For example, the transceiver component 40 can be modified to include more or fewer transmit and/or receive paths and/or more or fewer antennas.

The illustrated first receive path 42 includes a switch 31, a low noise amplifier 47, a digital step attenuator 49, an oscillator 22, a first mixer 23*a*, a second mixer 23*b*, a first programmable gain amplifier 25*a*, a second programmable gain amplifier 25*b*, a first filter 27*a*, a second filter 27*b*, a first analog-to-digital converter 29*a*, and a second analog-to-digital converter 29*b*. The illustrated second receive path 44 includes an input filter 33, a low noise amplifier 47, a digital step attenuator 49, an oscillator 22, a first mixer 23*a*, a second mixer 23*b*, a first programmable gain amplifier 25*a*, a second programmable gain amplifier 25*b*, a first filter 27*a*, a second filter 27*b*, a first analog-to-digital converter 29*a*, and a second analog-to-digital converter 29*b*. Although one implementation of the first and second receive paths 42, 44 is illustrated in FIG. 3, the first and second receive paths can be modified to include more or fewer components and/or a different arrangement of components.

An RF signal can be received on the first and/or second antennas 59*a*, 59*b* and provided to the first and second receive paths, respectively. For example, the first receive path includes the switch 31, which can be used to electrically connected the first antenna 59*a* to the input of the low noise amplifier 47 of the first receive path 42. Additionally, the second antenna 59*b* is electrically connected to the input filter 33 so as to provide a signal received on the second antenna 59*b* to the input filter 33. The input filter 33 can be a low pass filter, a band pass filter, or a high pass filter, depending on the application.

The low noise amplifier 47 can include an input for receiving a RF input signal, which can have a relatively small amplitude. The low noise amplifier 47 can be configured to amplify the signal while adding or introducing a relatively small amount of noise. The low noise amplifier 47 can provide the amplified output to an attenuator, such as the digital step attenuator 49. The attenuator can reduce the amplitude of the low noise amplifier output without appreciably distorting features of the low noise amplifier output. In certain implementations, the digital step attenuator 49 can be omitted in favor of employing an analog attenuation component.

The first and second mixers 23*a*, 23*b* can be configured to receive first and second local oscillator clock signals from the local oscillator 22. The first and second local oscillator clock signals can have about the same frequency and a phase difference equal to about a quarter of a period, or about 90°. The first and second mixers 23*a*, 23*b* can be configured to down convert the output of the digital step attenuator 49 using the first and second local oscillator clock signals, respectively, thereby generating first and second demodulated signals. The first and second demodulated signals can have a relative phase difference of about a quarter of a period, or about 90°, and can be used in a Q path and an I path, respectively. In certain implementations, one of the first or second oscillator clock signals is generated by phase shifting from the other.

The first and second local oscillator clock signals can each have a frequency selected so as to achieve a desired intermediate frequency and/or baseband frequency for the first and second demodulated signals. For example, multiplying the output of the digital step attenuator 49 by a sinusoidal signal from the oscillator can produce a mixed signal having a frequency content centered about the sum and difference frequencies of the carrier frequency of the digital step attenuator output signal and the frequency of the local oscillator 22.

The first and second demodulated signals can be amplified using, for example, the first and second programmable gain amplifiers 25*a*, 25*b*, respectively. To aid in reducing output noise, the outputs of the first and second programmable gain amplifiers 25*a*, 25*b* can be filtered using the first and second filters 27*a*, 27*b*, which can be any suitable filter, including, for example, low pass, band pass, or high pass filters. The outputs of the first and second filters 27*a*, 27*b* can be provided to the first and second analog-to-digital (A-to-D) converters 29*a*, 29*b*. The first and second A-to-D converters 29*a*, 29*b* can digitize an input to any suitable resolution. For example, the first and second A-to-D converters 29*a*, 29*b* can be used to generate multi-bit outputs for use by the base band processor 35. However, in certain implementations, the first and second A-to-D converters 29*a*, 29*b* can be 1-bit analog-to-digital converters, such as limiters or saturated A-to-D converters, and the output of the converters can be one-bit digital signals. The outputs of the first and second A-to-D converters 29*a*, 29*b* can be provided to the baseband processor 35 for processing.

The baseband processor 35 can be any suitable processor configured to process a baseband signal. For instance, the baseband processor 35 can include a digital signal processor, a microprocessor, a programmable core, the like, or any combination thereof. Moreover, in some implementations, two or more baseband processors 35 can be included in the electronic system 30.

The transmit path 46 can receive data from the baseband processor 35 and can be used to transmit RF signals using the first antenna 59a. As illustrated in FIG. 3, the transmit path 46 and the first receive path 42 can be configured to both operate using the first antenna 59a. However, in some implementations, the transmit path 46 can transmit a RF signal using an antenna that is not shared with a receive path. The illustrated transmit path 46 includes first and second digital-to-analog (D-to-A) converters 37a, 37b, first and second filters 39a, 39b, first and second mixers 41a, 41b, a local oscillator 43, a combiner 45, an attenuator 49, an output filter 51, and a power amplifier 58.

The baseband processor 35 can output a signal for a Q path and a signal for an I path. Each of these signals can be processed substantially in parallel using separate hardware until they are combined using the combiner 45. The first and second D-to-A converters 37a, 37b can each be used to convert a digital signal received from the baseband processor 35 to an analog signal. The first and second D-to-A converters 37a, 37b can have any suitable precision. The output of the first and second D-to-A converters 37a, 37b can be filtered using the first and second filters 39a, 39b, respectively. The outputs of the first and second filters 39a, 39b can be up converted using the first and second mixers 41a, 41b, respectively. For example, the first and second mixers 41a, 41b can each receive a clock signal generated using the local oscillator 43, which can be used to up convert a baseband input signal to an RF signal.

Signals from the Q path and the I path can be combined using the combiner 45 to generate a single RF signal suitable for radio frequency transmission. The output of the combiner 45 can be provided to the digital step attenuator 49. The digital step attenuator 49 can have a variable gain, for example, the gain of the attenuator can be controlled based on one or more control signals provided by the baseband processor 35.

The output of the attenuator 49 can be filtered using the filter 51, which can be, for example, a low pass, band pass, or high pass filter configured to remove noise and/or unwanted frequency components from the signal. The output of the output filter 51 can be amplified by a power amplifier 58. In some implementations, the power amplifier 58 includes a plurality of stages cascaded to achieve a target gain. The power amplifier 58 can provide an amplified RF signal to the first antenna 59a through the switch 31.

The amplifiers described herein can be used in the electronic system 30 of FIG. 3. For example, one or more RF amplifiers can be used, for example, for amplification of signals in the transceiver component 40, including for example, amplification of clocks generated by the local oscillators 22, 43, amplification of the outputs of the low noise amplifiers 47, amplification of the inputs and/or outputs of the filters 27a, 27b, 51, and/or amplification of the outputs of the mixers 23a, 23b and/or the mixers 41a, 41b.

Figure 4A:
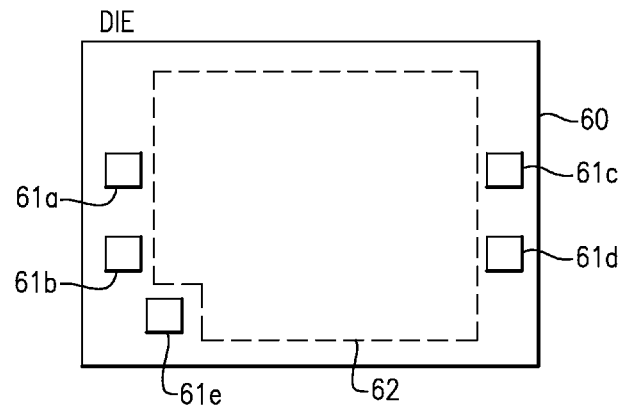
FIG. 4A is a schematic top plan view of one example of a die.

FIG. 4A is a schematic top plan view of one example of a die 60. The illustrated die 60 includes devices 62, a first pad 61a, a second pad 61b, a third pad 61c, a fourth pad 61d and a fifth pad 61e. In certain implementations, the devices 62 can include a plurality of transistors, resistors, diodes and/or other electrical components electrically connected to form an RF amplifier. For example, the devices 62 can include bipolar and/or field effect transistors electrically connected in a Darlington configuration. The die 60 also includes the pads 61a-61e, which can include signal pads, power high or power supply pads and/or power low or ground pads that can aid in helping the die 60 communicate with external circuitry. One or more metal layers disposed on the die 60 can be used to provide electrical connections between the devices 62 and the pads 61a-61e. Wire bonds can be used to electrically connect each of the pads 61a-61e to conductors associated with a package substrate.

Figure 4B:
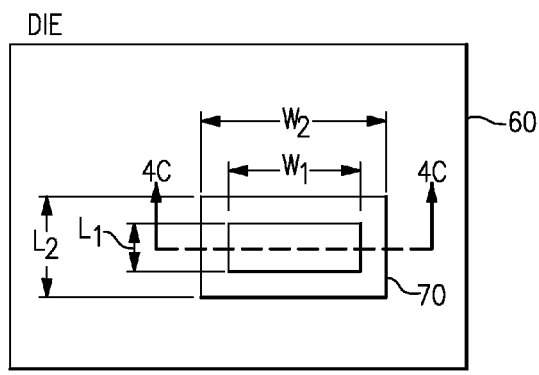
FIG. 4B is a schematic bottom plan view of the die of FIG. 4A.
Figure 4C:
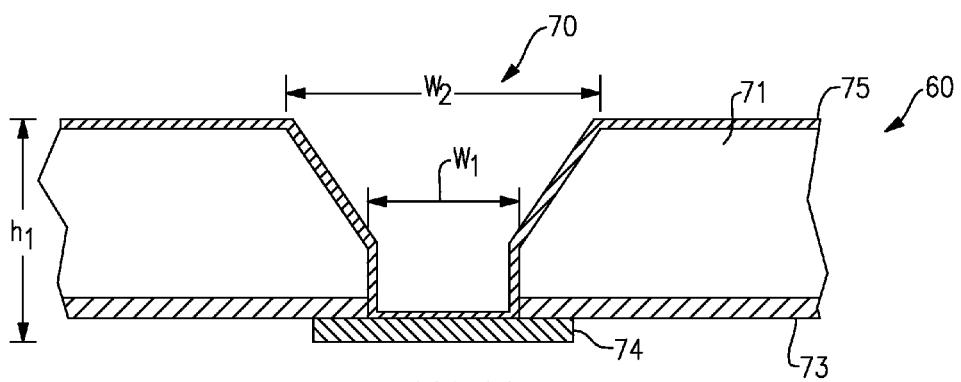
FIG. 4C is a cross section of the die of FIGS. 4A-4B taken along the lines 4C-4C.

FIG. 4B is a schematic bottom plan view of the die 60 of FIG. 4A. FIG. 4C is a cross section of the die 60 of FIGS. 4A-4B taken along the lines 4C-4C shown in FIG. 4B. The illustrate die 60 includes a through-wafer via 70, a substrate 71, an epitaxial layer 73, a first conductive layer 74, and a second conductive layer 75. Although the die 60 is illustrated as including a single through-wafer via 70, in certain implementations, the die 60 includes a plurality of through-wafer vias 70.

The substrate 71 can be, for example, a gallium arsenide (GaAs) substrate having any suitable thickness, such as a thickness $h_1$ in the range of about 80 μm to about 120 μm. The epitaxial layer 73 is formed on a first surface of the die 60, and can include, for example, a sub-collector layer, a collector layer, a base layer and/or an emitter layer to aid in forming bipolar transistor structures. Although the die 60 is illustrated as including the epitaxial layer 73, in certain embodiments, the epitaxial layer 73 can be omitted. Additionally, although the die 60 is described as being a GaAs die, the die 60 can be any suitable die with or without an epitaxial layer, including, for example, a gallium nitride (GaN) die, a silicon (Si) die, or an indium phosphide (InP) die.

The through-wafer via 70 can define a cavity in the die 60. The through-wafer via 70 can aid in providing electrical connections between opposing sides of the substrate 71. In certain implementations, the through-wafer via 70 includes a first end in the die 60 having a width $W_1$ and a length $L_1$ and a second end having a width $W_2$ and a length $L_2$. In one embodiment, $W_2$ ranges between about 60 μm to about 120 μm, $L_2$ ranges between about 60 μm to about 120 μm, $W_1$ ranges between about 15 μm to about 50 μm, and $L_1$ ranges between about 20 μm to about 60 μm.

One or more transistor devices can be formed in the epitaxial layer 73 on the first surface of the substrate 71. The first surface of the substrate 71 can also include the first conductive layer 74, which can be used to make electrical connections on the die 60, such as electrical connections between devices formed in the epitaxial layer 73. Additionally, a portion of the first conductive layer 74 can be positioned beneath the through-wafer via 70 so as to allow electrical connections between the first and second surfaces of the substrate 71. For example, the second conductive layer 75 can be included on the second surface of the substrate 71 and over the through-wafer via 70, and the first and second conductive layers 74, 75 can electrically contact in a portion of the through-wafer via 70. In certain implementations, the epitaxial layer 73 includes a plurality of bipolar transistors and the second conductive layer 75 is used to form a ground plane, and the through-wafer via 70 is used to provide an electrical path between the transistors and the conductive ground plane.

Although a particular implementation of the die 60 was described above, the teachings described herein are applicable to a wide range of dies.

Overview of RF Amplifier Systems

In certain implementations described herein, amplifiers are provided that include a first transistor and a second transistor electrically connected in a Darlington configuration. The first and second transistors are disposed on a die, and the first transistor is configured to amplify an input RF signal and provide the amplified signal to the second transistor. The first and second transistors can be electrically connected to a power low or ground node through first and second bias circuits, respectively. In certain implementations, an inductor is disposed in the path from the first transistor to the ground node to aid in improving the third order distortion of the amplifier. For example, the second transistor can be electrically connected to the ground node using a low-impedance substrate via, such as a through-wafer via, while the first transistor can be electrically connected to the ground node using a pad and an inductive wire bond electrically connected between the pad and the ground node. In some implementations, a spiral inductor is disposed on the die and inserted in the path from the first transistor to the ground node. By providing inductance in the path of the first transistor to ground, linearity of the amplifier can be improved by reducing the third order distortion of the amplifier.

Figure 5A:
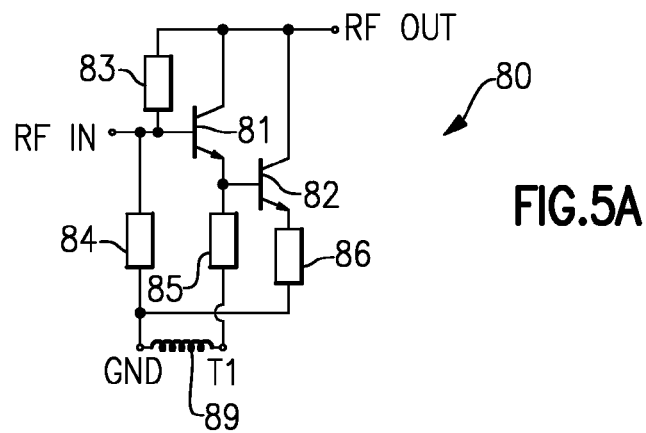
FIG. 5A is a circuit diagram illustrating one embodiment of a RF amplifier.

FIG. 5A is a circuit diagram illustrating one embodiment of a RF amplifier 80. The RF amplifier 80 includes a first NPN bipolar transistor 81, a second NPN bipolar transistor 82, an inductor 89, a first bias circuit 83, a second bias circuit 84, a third bias circuit 85 and a fourth bias circuit 86.

The first and second bias circuits 83, 84 each include a first end electrically connected to a base of the first NPN bipolar transistor 81 at a node RF IN. The first bias circuit 83 further includes a second end electrically connected to a collector of the first NPN bipolar transistor 81 and to a collector of the second NPN bipolar transistor 82 at a node RF OUT. The second bias circuit 84 further includes a second end electrically connected to a first end of the fourth bias circuit 86 and to a first end of the inductor 89 at a node GND. The fourth bias circuit 86 further includes a second end electrically connected to an emitter of the second NPN bipolar transistor 82. The third bias circuit 85 includes a first end electrically connected to an emitter of the first NPN bipolar transistor 81 and to a base of the second NPN bipolar transistor 82, and a second end electrically connected to a second of the inductor 89 at a node T1. In certain implementations the node GND is associated with a ground supply of the RF amplifier 80. However, the node GND can be any suitable power low supply.

The first and second NPN bipolar transistors 81, 82 are electrically connected in a Darlington configuration. For example, the base of the first NPN bipolar transistor 81 has been configured to receive a signal on the node RF IN, and the emitter of the first NPN bipolar transistor 81 has been configured to provide an amplified version of the signal to the base of the second NPN bipolar transistor 82. The second NPN bipolar transistor 82 can further amplify the signal to generate an output signal on the node RF OUT.

Electrically connecting the first and second NPN bipolar transistors 81, 82 in a Darlington configuration can aid in providing an amplification circuit that has a relatively high gain over a relatively wide bandwidth. Thus, one or more amplification circuits such as the amplifier 80 can be cascaded to achieve a target gain. Additionally, since the bandwidth of the amplifier 80 is relatively wide, the amplifier 80 can be used over a wide range of frequencies, such as carrier frequencies, transmit frequencies, and/or intermediate frequencies of an RF system. Thus, the amplifier 80 can serve as a basic amplification component that can be used in amplification blocks within a wide variety of RF electronic systems, including, for example, the electronic devices and systems 11, 30 of FIGS. 2 and 3.

The first and second NPN bipolar transistors 81, 82 are biased using the third and fourth bias circuits 85, 86, respectively. For example, the third bias circuit 85 is disposed between the emitter of the first NPN bipolar transistor 81 and the node T1. Likewise, the fourth bias circuit 86 is disposed between the emitter of the second NPN bipolar transistor 82 and the node GND.

As shown in FIG. 5A, the inductor 89 is disposed between the emitter of the first NPN bipolar transistor 81 and the ground node GND. By providing the inductor 89 between the emitter of the NPN bipolar transistor 81 and the node GND, the intermodulation distortion of the amplifier 80 can be improved. For example, it has been found that the third order intercept point (IP3) of an amplifier, which can be used to quantify the amplifier's third order distortion, can be improved by including the inductor 89 in series with the third bias circuit 85 used to bias the first NPN bipolar transistor 81. Although FIG. 5A illustrates a configuration in which the third bias circuit 85 is disposed between the emitter of the first NPN bipolar transistor 81 and the first inductor 89, in certain implementations, the order of the third bias circuit 85 and the inductor 89 can be reversed. For example, in certain implementations, the inductor 89 can be disposed between the emitter of the first NPN bipolar transistor 81 and the first end of the third bias circuit 85, and the second end of the third bias circuit 85 can be electrically connected to the GND node.

The first to fourth bias circuits 83-86 can be any suitable bias circuits. For example, the first to fourth bias circuits 83-86 can include resistors having a resistance selected to achieve a target biasing condition. Additionally, the first to fourth bias circuits 83-86 can include diodes and/or transistor components to aid in providing enhanced performance, such as improved performance over temperature and/or supply variation.

The inductor 89 can be any suitable inductor. For example, the inductor 89 can be formed at least in part using a spiral inductor formed from metals disposed on a die used to form the amplifier 80. In certain implementations, the inductor 89 is formed using a spiral inductor formed from trace on a package substrate and/or using a surface mount component disposed on a package substrate. In one embodiment, the inductor 89 has an inductance ranging between about 0.3 nH and about 4 nH.

In certain implementations, the first and second NPN bipolar transistors 81, 82 and the first through fourth bias circuits 83-86 are formed on a first surface of a die, and the RF IN, RF OUT, and T1 nodes are each electrically connected to pads disposed over the first surface of the die. Additionally, the GND node can be formed from metal disposed on a second surface of the die opposite the first, and a substrate via, such as a through-wafer via, can be used to electrically connect one or more electrical components disposed on the first side of the die to the GND node. The die can be attached to a package substrate and configured such that the GND node electrically contacts a die attach paddle. In certain implementations, a bond wire can be electrically connected between the die attach paddle and the pad of the die that is electrically connected to the node T1, and the bond wire and the pad can operate at least in part as the inductor 89.

Figure 5B:
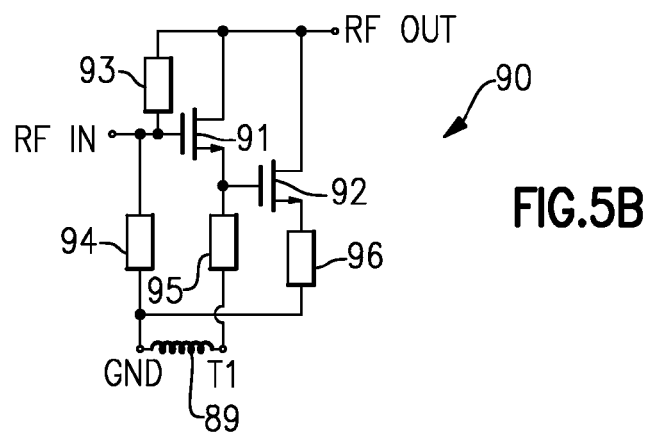
FIG. 5B is a circuit diagram illustrating another embodiment of a RF amplifier.

FIG. 5B is a circuit diagram illustrating another embodiment of a RF amplifier 90. The RF amplifier 90 includes a first n-type field effect semiconductor (NFET) transistor 91, a second NFET transistor 92, an inductor 89, a first bias circuit 93, a second bias circuit 94, a third bias circuit 95 and a fourth bias circuit 96.

The first and second bias circuits 93, 94 each include a first end electrically connected to a gate of the first NFET transistor 91 at a node RF IN. The first bias circuit 93 further includes a second end electrically connected to a drain of the first NFET transistor 91 and to a drain of the second NFET transistor 92 at a node RF OUT. The second bias circuit 94 further includes a second end electrically connected to a first end of the fourth bias circuit 96 and to a first end of the inductor 89 at a node GND. The fourth bias circuit 94 further includes a second end electrically connected to a source of the second NFET transistor 92. The third bias circuit includes a first end electrically connected to a source of the first NFET transistor 91 and to a gate of the second NFET transistor 92, and a second end electrically connected to a second of the inductor 89 at a node T1.

The amplifier 90 of FIG. 5B is similar to the amplifier 80 of FIG. 5A, except the amplifier 90 of FIG. 5B includes NFET transistors rather than NPN transistors. The NFET transistors can be any suitable field effect transistor, including, for example, pseudomorphic high electron mobility transistors (pHEMTs), junction field effect transistors (JFETs), metal semiconductor field effect transistors (MESFETs), and/or metal oxide semiconductor field effect transistors (MOSFETs). The amplification schemes described herein can be applied to amplifiers using any suitable transistor, including, for example, bipolar and/or field effect transistors. Although FIGS. 5A-5B show configurations using n-type transistors, the teachings described herein can be applied to p-type transistors, such as PNP bipolar transistors and/or p-type field effect transistors (PFETs).

Figure 5C:
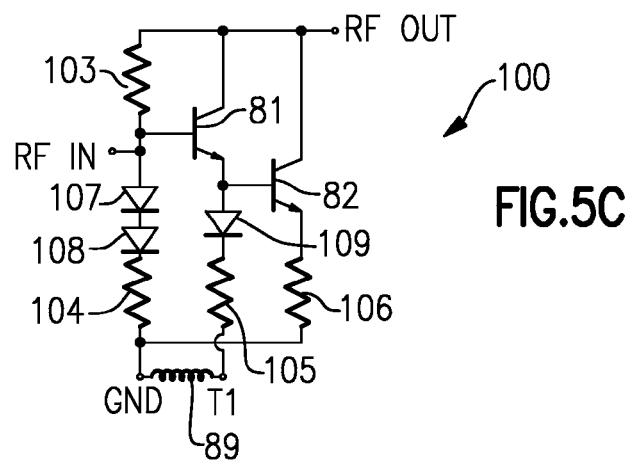
FIG. 5C is a circuit diagram illustrating yet another embodiment of a RF amplifier.

FIG. 5C is a circuit diagram illustrating yet another embodiment of a RF amplifier 100. The illustrated amplifier 100 includes a first resistor 103, a second resistor 104, a third resistor 105, a fourth resistor 106, a first diode 107, a second diode 108, a third diode 109, the first NPN bipolar transistor 81, the second NPN bipolar transistor 82, and the inductor 89.

The first resistor 103 includes a first end electrically connected to the base of the NPN bipolar transistor 81 and to an anode of the first diode 107 at a node RF IN. The first resistor 103 further includes a second end electrically connected to the collector of the first NPN bipolar transistor 81 and to the collector of the second NPN bipolar transistor 82 at the node RF OUT. The first diode 107 further includes a cathode electrically connected to an anode of the second diode 108. The second diode 108 further includes a cathode electrically connected to a first end of the second resistor 104. The second resistor 104 further includes a second end electrically connected to a first end of the fourth resistor 106 and to a first end of the first inductor 89 at a node GND. The fourth resistor 106 further includes a second end electrically connected to an emitter of the second NPN bipolar transistor 82. The third diode 109 includes an anode electrically connected to the emitter of the first NPN bipolar transistor 81 and to the base of the second NPN bipolar transistor 82. The third diode 109 further includes a cathode electrically connected to a first end of the third resistor 105. The third resistor 105 further includes a second end electrically connected to a second end of the inductor 89 at the node T1.

The illustrated first through fourth resistors 103-106 and first through third diodes 107-109 can aid in biasing the first and second NPN bipolar transistors 81, 82. For example, the first and second resistors 103, 104 can aid in establishing a voltage of the base of the first NPN bipolar transistor 81, while the third and fourth resistors 105, 106 can be used to establish an emitter bias current of the first and second NPN bipolar transistors 81, 82, respectively. The first through third diodes 107-109 can be included to improve the temperature performance of the amplifier 100 by balancing variations in emitter bias current of the first and second NPN bipolar transistors 81, 82 over temperature. For example, the first and second diodes 107, 108 can be configured to have similar geometries as the base-emitter junctions of the first and second NPN bipolar transistors 81, 82, respectively. Similarly, the third diode 109 can be configured to have a similar geometry as the base-emitter junction of the second NPN bipolar transistor 82. In certain implementations, the first, second and/or third diodes 107-109 can be replaced with bipolar transistors electrically connected in a diode configuration.

The first diode 107, the second diode 108, and the second resistor 104 are electrically connected in series between the node RF IN and the node GND. Although FIG. 5C illustrates one particular order of the first diode 107, the second diode 108, and the second resistor 104, the order of the components can be interchanged. Similarly, although one particular order of the series combination of the third diode 109 and the third resistor 105 is illustrated, the order of the third diode 109 and the third resistor 105 can be reversed.

Additional details of the amplifier 100 can be as described above with respect to FIGS. 5A-5B.

Figure 6:
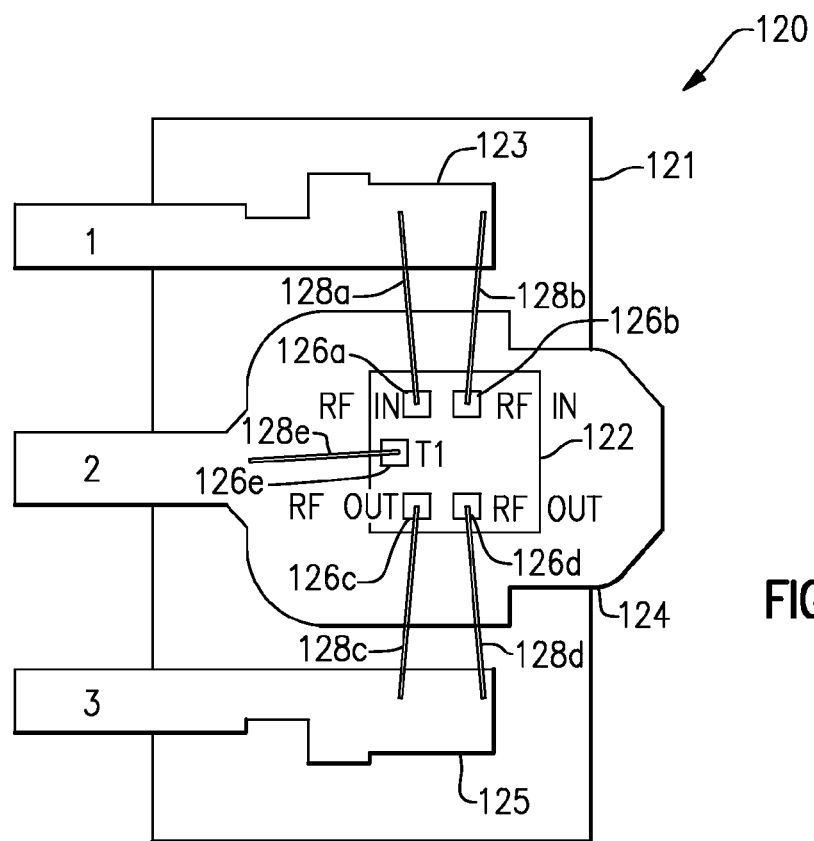
FIG. 6 is a schematic diagram of a packaged RF amplifier in accordance with one embodiment.

FIG. 6 is a schematic diagram of a packaged RF amplifier 120 in accordance with one embodiment. The illustrated amplifier 120 includes a package substrate 121, a die 122, and conductors connected to the package substrate 121, such as a first conductor 123 associated with a first package pin 1, a second conductor 124 associated with a second package pin 2, and a third conductor 125 associated with a third package pin 3. In certain implementations, the first package pin 1 can be an input pin, the second package pin 2 can be a ground or power low pin, and the third package pin 3 can be an output pin. As illustrated in FIG. 6, the second conductor 124 has been patterned to form a die attach paddle, and the die 122 has been attached to the second conductor 124 associated with the package substrate 121.

In certain implementations, the packaged RF amplifier 120 is a lead frame package, the die 122 is mounted to the second conductor 124, and the package substrate 121 is implemented as encapsulation surrounding all or part of the conductors 123-125 and the die 122. However, other configurations are possible, such as implementations in which the package substrate 121 includes a board having conductors formed thereon.

In one embodiment, the second package pin 2 is exposed through the bottom of the package substrate 121 and can be soldered to a printed circuit board (PCB) for thermal and/or electrical contact. Additionally, in certain configurations the first and third package pins 1, 3 can be exposed on a side of the package substrate 121 and can bend down to reach a plane flush with a bottom of the second package pin 2. In one embodiment, the first, second, and third conductors 123-125 are associated with a lead frame, such as a copper lead including copper bridges that are sheared off or removed after the die 122 is mounted, bonded, and encapsulated.

The die 122 can be an amplifier die, and include circuitry configured to form, for example, any of the amplifiers 80, 90, 100 of FIGS. 5A-5C. Additionally, in certain implementations the die 122 can be configured to include circuitry configured to form any of the amplifiers 200, 220, 240, 260 described below with reference to FIGS. 9A-10. The die 122 includes first through fifth pads 126a-126e disposed on a first surface of the die. In certain implementations, each of the pads 126a-126e corresponds one of the nodes shown in FIGS. 5A-5C. For example, the first and second pads 126a, 126b can each correspond to the node RF IN of FIGS. 5A-5C, the third and fourth pads 126c, 126d can each correspond to the node RF OUT of FIGS. 5A-5C, and the fifth pad 126e can correspond to the node T1 of FIGS. 5A-5C. The die 122 can include a conductive surface on a second side of the die 122 used to attach the die 122 to the second conductor 124, and the conductive surface of the die 122 can provide electrical contact between a power low or ground node of the die and the second conductor 124. For example, the die 122 can include a through-wafer via, such as the through-wafer via 70 of FIGS. 4B-4C, which can be used to electrically connect a power low or ground node within the die 122 to the second conductor 124 associated with the package substrate 121. Thus, in certain implementations, the node GND of FIGS. 5A-5C can correspond to the second conductor 124 of the packaged amplifier 120.

Bond wires can be used to electrically connect the pads 126a-126e to the conductors 123-125 associated with the package substrate 121. For example, a first bond wire 128a has been used to electrically connect the first pad 126a of the die 122 to the first conductor 123, and a second bond wire 128b has been used to electrically connect the second pad 126b of the die 122 to the first conductor 123. Additionally, a third bond wire 128c has been used to electrically connect the third pad 126c of the die 122 to the third conductor 125, and a fourth bond wire 128d has been used to electrically connect the fourth pad 126d of the die 122 to the third conductor 125. Furthermore, a fifth bond wire 128e has been used to electrically connect the fifth pad 128e of the die 122 to the second conductor 124. As illustrated in FIG. 6, certain nodes of the die 122, such as the nodes RF IN and RF OUT, include a plurality of pads and bond wires electrically connected in parallel to the same conductor of the packaged RF amplifier 120. By electrically connecting pads and bond wires in parallel, the inductance of the connection between the die 122 and a conductor associated with the package substrate 121 can be reduced.

As described above, the second conductor 124 that is used to mount the die 122 to the package substrate 121 can correspond to the GND node of FIGS. 5A-5C. Thus, when the die 122 is mounted to the package substrate 121, the GND node of FIGS. 5A-5C can be electrically connected to the second conductor 124 and to the second package pin 2 of the packaged amplifier 120. As shown in FIG. 6, the fifth bond wire 126e has been used to electrically connect the second conductor 124 to the fifth pad 126e, which can correspond to the node T1 of FIGS. 5A-5C. In certain implementations, the fifth pad 126e and the fifth bond wire 128e can operate as the inductor 89 of FIGS. 5A-5C. Forming the inductor 89 at least in part by using a pad and/or a bond wire can aid in providing a relatively large inductance at a relatively low cost and/or area. Additionally, the length of the bond wire can be selected after manufacture of the die 122, and thus can be selected based on the application the amplifier 120 is to be used in and/or to compensate for a process variation of the die 122.

Figure 7:
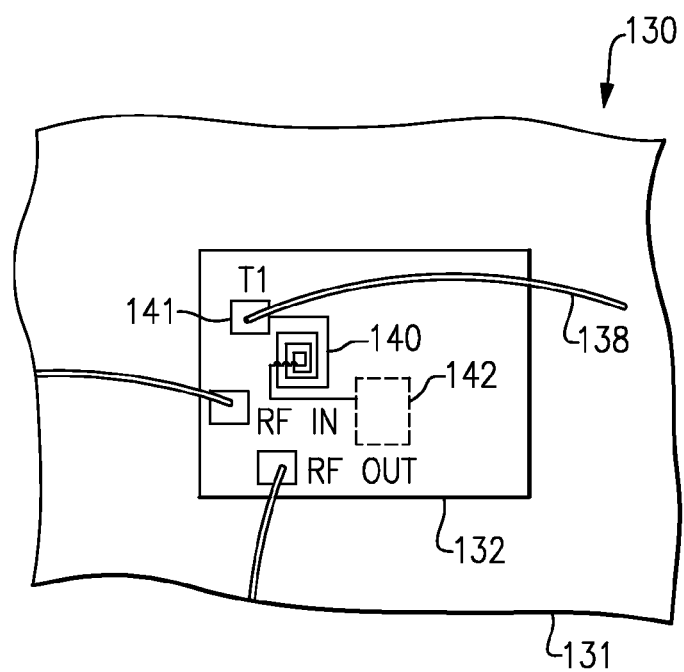
FIG. 7 is a schematic diagram of a packaged RF amplifier in accordance with another embodiment.

FIG. 7 is a schematic diagram of a packaged RF amplifier 130 in accordance with another embodiment. The packaged RF amplifier 130 includes a package substrate 131 and a die 132. The die includes a first pad 141, a bias circuit 142, and a spiral inductor 140.

The die 132 can be an amplifier die, and can include circuitry configured to form, for example, any of the amplifiers of FIGS. 5A-5C. The die 132 can include the inductor 140, which can include one or more coils formed from conductive trace disposed on the die 122. The inductor 140 includes a first end electrically connected to a bias circuit 142 and a second end electrically connected to the pad 141, which can correspond to the node T1 of the FIGS. 5A-5C. A bond wire 138 has been used to electrically connect the pad 141 to a conductor associated with the package substrate 131. In certain implementations, the inductor 140, the pad 141, and the bond wire 138 operate as the inductor 89 of FIGS. 5A-5C. For example, the bias circuit 142 can correspond to the second bias circuit 85 of FIG. 5A, the second bias circuit 95 of FIG. 5B, or the third resistor 105 and the third diode 109 of FIG. 5C, and the bias circuit 142 can be electrically connected to the GND node through the spiral inductor 140, the pad 141, and the bond wire 138. By configured the packaged amplifier 130 in this manner, the inductance of the inductor can be increased. In certain implementations, such as the configuration shown in FIG. 7, the bond wire 138 can loop over the die to aid in providing a relatively large bond wire length and inductance. For example, the bond wire 138 can be configured to pass over more than half of a length of the die.

Figure 8A:
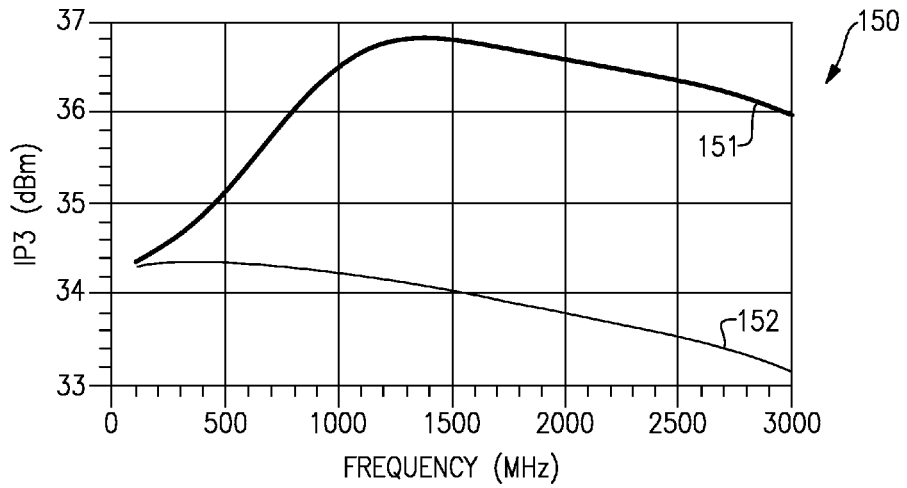
FIG. 8A is a graph of third order intercept point (IP3) versus frequency for two examples of RF amplifiers.

FIG. 8A is a graph 150 of third order intercept point (IP3) versus frequency for two examples of RF amplifiers. The graph 150 includes a first plot 151 of IP3 versus frequency for one implementation of the amplifier 100 of FIG. 5C. The graph 150 further includes a second plot 152 of IP3 versus frequency for the amplifier of the first plot 151 with the inductor 89 removed in favor of providing an electrical short between the GND node and the T1 node of FIG. 5C. As illustrated in the graph 150, inclusion of the inductor 89 of FIG. 5C can aid in improving IP3.

Figure 8B:
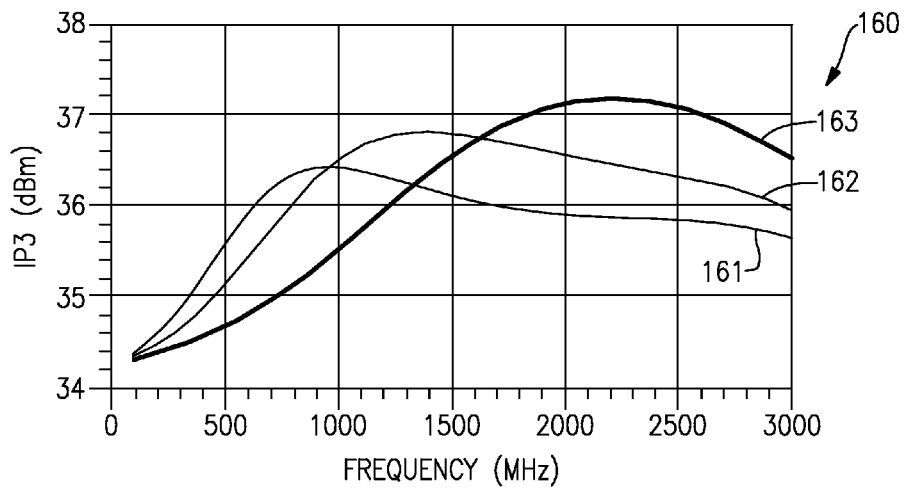
FIG. 8B is a graph of third order intercept point (IP3) versus frequency for three examples of RF amplifiers.

FIG. 8B is a graph 160 of third order intercept point (IP3) versus frequency for three examples of RF amplifiers. The graph 160 includes a first plot 161, a second plot 162, and a third plot 163 which correspond to three implementations of the amplifier 100 shown in FIG. 5C. The first, second and third plots 161-163 correspond to implementations with inductances of the inductor 89 equal to about 3 nH, about 2 nH, and about 1 nH, respectively. As shown in FIG. 8B, the frequency peak of the IP3 of the amplifier can be varied by selecting the inductance of the inductor. For example, an amplifier including a smaller inductor can have an IP3 peak at a greater frequency. In certain implementations, the length of the bond wire used to electrically connect the T1 node to the GND node can be selected to achieve a peak IP3 at a particular frequency.

Figure 9A:
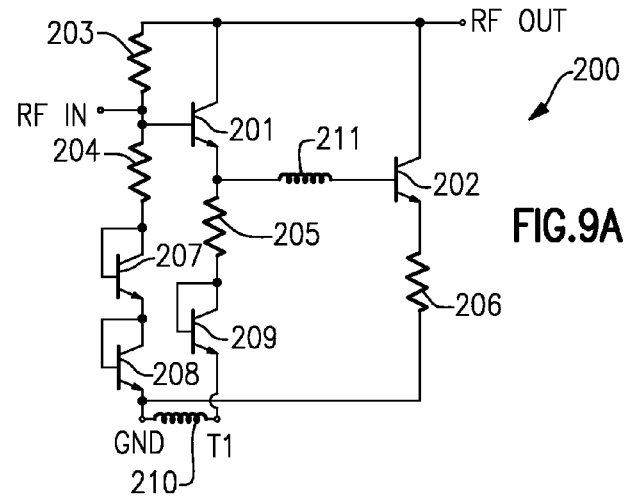
FIG. 9A is a circuit diagram illustrating one embodiment of a RF amplifier.

FIG. 9A is a circuit diagram illustrating one embodiment of a RF amplifier 200. The illustrated amplifier 200 includes a first resistor 203, a second resistor 204, a third resistor 205, a fourth resistor 206, a first NPN bipolar transistor 201, a second NPN bipolar transistor 202, a third NPN bipolar transistor 207, a fourth NPN bipolar transistor 208, a fifth NPN bipolar transistor 209, a first inductor 210 and a second inductor 211.

The first resistor 203 includes a first end electrically connected to a base of the first NPN bipolar transistor 201 and to a first end of the second resistor 204 at a node RF IN. The first resistor 203 further includes a second end electrically connected to a collector of the first NPN bipolar transistor 201 and to a collector of the second NPN bipolar transistor 202 at a node RF OUT. The second resistor 204 further includes a second end electrically connected to a base and a collector of the third NPN bipolar transistor 207. The third NPN bipolar transistor 207 further includes an emitter electrically connected to a base and a collector of the fourth NPN bipolar transistor 208. The fourth NPN bipolar transistor 208 further includes an emitter electrically connected to a first end of the first inductor 210 and to a first end of the fourth resistor 206 at a node GND. The fourth resistor 206 further includes a second end electrically connected to an emitter of the second NPN bipolar transistor 202. The second NPN bipolar transistor 202 further includes a base electrically connected to a first end of the second inductor 211. The second inductor 211 further includes a second end electrically connected to an emitter of the first NPN bipolar transistor 201 and to a first end of the third resistor 205. The third resistor 205 further includes a second end electrically connected to a base and a collector of the fifth NPN bipolar transistor 209. The fifth NPN bipolar transistor 209 further includes an emitter electrically connected to a second end of the first inductor 210 at a node T1.

The illustrated first to fourth resistors 203-206 and third to fifth NPN bipolar transistors 207-209 can aid in biasing the first and second NPN bipolar transistors 201, 202. For example, the first and second resistors 203, 204 can aid in establishing a voltage of the base of the first NPN bipolar transistor 201, while the third and fourth resistors 205, 206 can be used to establish an emitter bias current of the first and second NPN bipolar transistors 201, 202, respectively. The third to fifth NPN bipolar transistors 207-209 can be included to improve the temperature performance of the amplifier 200 by balancing variations in emitter bias current of the first and second NPN bipolar transistors 201, 202 over temperature. For example, the third and fourth NPN bipolar transistors 207, 208 can be configured to have base-emitter junctions with similar geometries as the base-emitter junctions of the first and second NPN bipolar transistors 201, 202, respectively. Similarly, the fifth NPN bipolar transistor 209 can be configured to have a base-emitter junction with similar geometry as the base-emitter junction of the second NPN bipolar transistor 202.

The illustrated amplifier 200 also includes the second inductor 211 inserted between the emitter of the first NPN bipolar transistor 201 and the base of the second NPN bipolar transistor 202. Inclusion of the second inductor 211 can improving the high frequency gain of the amplifier 200. However, the second inductor 211 can also reduce output match of the amplifier 200, and thus in certain implementations, the second inductor 211 can be omitted.

Additional details of the amplifier 200 can be similar to those described earlier with respect to FIGS. 5A-7. For example, the amplifier 200 can be formed on a die, and the nodes RF IN, RF OUT and T1 can each be electrically connected to pads disposed over a first surface of the die. Additionally, the GND node can be formed from metal disposed on a second surface of the die opposite the first, and a substrate via, such as a through-wafer via, can be used to electrically connect one or more electrical components disposed on the first side of the die to the GND node. The die can be mounted onto a package substrate such that the GND node electrically contacts a die attach paddle. In certain implementations, a bond wire can be electrically connected between the die attach paddle and the pad of the die that is electrically connected to the node T1, and the bond wire and the pad can operate at least in part as the inductor 210. In one embodiment, the inductor 210 has an inductance ranging between about 0.3 nH and about 4 nH.

Figure 9B:
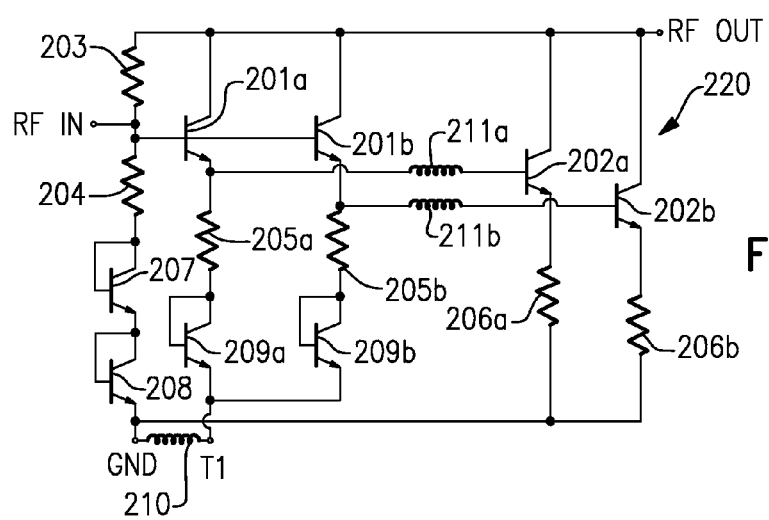
FIG. 9B is a circuit diagram illustrating another embodiment of a RF amplifier.

FIG. 9B is a circuit diagram illustrating another embodiment of a RF amplifier 220. The illustrated amplifier 220 includes a first resistor 203, a second resistor 204, third resistors 205a, 205b, fourth resistors 206a, 206b, first NPN bipolar transistors 201a, 201b, second NPN bipolar transistors 202a, 202b, a third NPN bipolar transistor 207, a fourth NPN bipolar transistor 208, fifth NPN bipolar transistors 209a, 209b, a first inductor 210 and second inductors 211a, 211b.

The first resistor 203 includes a first end electrically connected to a base of each of the first NPN bipolar transistors 201a, 201b and to a first end of the second resistor 204 at a node RF IN. The first resistor 203 further includes a second end electrically connected to a collector of each of the first NPN bipolar transistors 201a, 201b and to a collector of each of the second NPN bipolar transistors 202a, 202b at a node RF OUT. The second resistor 204 further includes a second end electrically connected to a base and a collector of the third NPN bipolar transistor 207. The third NPN bipolar transistor 207 further includes an emitter electrically connected to a base and a collector of the fourth NPN bipolar transistor 208. The fourth NPN bipolar transistor 208 further includes an emitter electrically connected to a first end of the first inductor 210 and to a first end of each of the fourth resistors 206a, 206b at a node GND. The fourth resistor 206a further includes a second end electrically connected to an emitter of the second NPN bipolar transistor 202a. The fourth resistor 206b further includes a second end electrically connected to an emitter of the second NPN bipolar transistor 202b. The second NPN bipolar transistor 202a further includes a base electrically connected to a first end of the second inductor 211a. The second NPN bipolar transistor 202b further includes a base electrically connected to a first end of the second inductor 211b. The second inductor 211a further includes a second end electrically connected to an emitter of the first NPN bipolar transistor 201a and to a first end of the third resistor 205a. The second inductor 211b further includes a second end electrically connected to an emitter of the first NPN bipolar transistor 201b and to a first end of the third resistor 205b. The third resistor 205a further includes a second end electrically connected to a base and a collector of the fifth NPN bipolar transistor 209a. The third resistor 205b further includes a second end electrically connected to a base and a collector of the fifth NPN bipolar transistor 209b. The fifth NPN bipolar transistor 209a, 209b each further include an emitter electrically connected to a second end of the first inductor 210 at a node T1.

As shown in FIG. 9B, the amplifier 220 can include one or more parallelized amplification stages. For example, the first NPN bipolar transistors 201a, 201b, the third resistors 205a, 205b, and the fifth NPN bipolar transistors 209a, 209b of FIG. 9B illustrate a parallelization of the first NPN bipolar transistor 201, the third resistor 205, and the fifth NPN bipolar transistor 209 of FIG. 9A. Similarly, the second inductors 211a, 211b, the second NPN bipolar transistors 202a, 202b, and the fourth resistors 206a, 206b of FIG. 9B illustrate a parallelization of the second inductor 211, the second NPN bipolar transistor 202, and the fourth resistor 206 FIG. 9A. In certain implementations, the amplifiers described herein can include one or more parallelized amplification stages. Parallelizing amplifier stages can aid in improving thermal dissipation of an amplifier.

The second inductor 210 is disposed between the node GND and the node T1. In certain implementations, a bond wire can be electrically connected between a die attach paddle forming the node GND and a pad of a die that is electrically connected to the node T1, and the bond wire and the pad can operate at least in part as the inductor 210. Thus, even in implementations in which the amplifier includes parallelized stages, a bond wire and/or pad can be used to form the inductor 210. Additional details of the amplifier 220 can be similar to those described earlier.

Figure 9C:
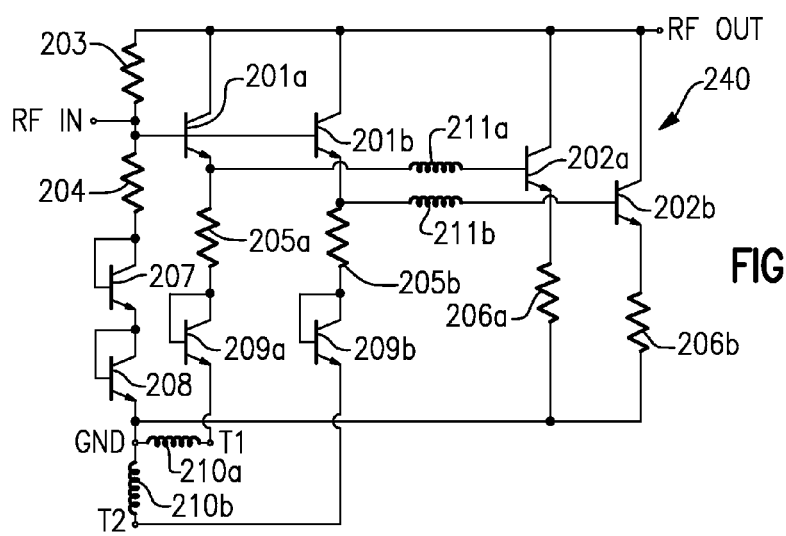
FIG. 9C is a circuit diagram illustrating yet another embodiment of a RF amplifier.

FIG. 9C is a circuit diagram illustrating yet another embodiment of a RF amplifier 240. The illustrated amplifier 240 includes a first resistor 203, a second resistor 204, third resistors 205a, 205b, fourth resistors 206a, 206b, first NPN bipolar transistors 201a, 201b, second NPN bipolar transistors 202a, 202b, a third NPN bipolar transistor 207, a fourth NPN bipolar transistor 208, fifth NPN bipolar transistors 209a, 209b, first inductors 210a, 210b and second inductors 211a, 211b.

The amplifier 240 of FIG. 9C is similar to the amplifier 220 of FIG. 9B. However, in contrast to the amplifier 220 of FIG. 9B, the amplifier 240 of FIG. 9C includes the first inductors 210a, 210b. For example, the first inductor 210a includes a first end electrically connected to the node GND and a second end electrically connected to the emitter of the fifth NPN bipolar transistor 209a at a node T1. Additionally, the first inductor 210b includes a first end electrically connected to the node GND and a second end electrically connected to the emitter of the fifth NPN bipolar transistor 209b at a node T2. In certain implementations, a first bond wire can be electrically connected between a die attach paddle forming the node GND and a first pad of a die that is electrically connected to the node T1, and a second bond wire can be electrically connected between the die attach paddle forming the node GND and a second pad of a die that is electrically connected to the node T2. Thus, in certain implementations, an amplifier can include parallelized stages, and each of the stages can include a bond wire and/or pad used to form an inductor, such as the inductors 210a, 210b. Additional details of the amplifier 240 can be similar to those described earlier.

Figure 10:
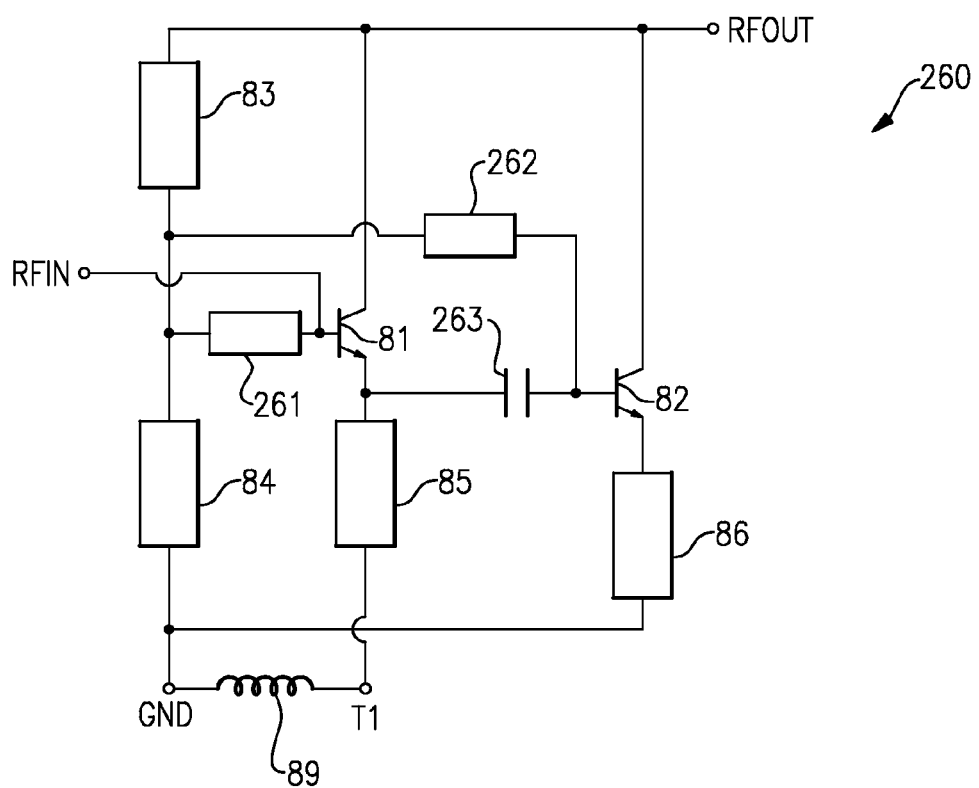
FIG. 10 is a circuit diagram illustrating yet another embodiment of a RF amplifier.

FIG. 10 is a circuit diagram illustrating yet another embodiment of a RF amplifier 260. The RF amplifier 260 includes the first NPN bipolar transistor 81, the second NPN bipolar transistor 82, the inductor 89, the first bias circuit 83, the second bias circuit 84, the third bias circuit 85, the fourth bias circuit 86, a first base biasing circuit 261, a second base biasing circuit 262, and a DC blocking capacitor 263.

The base of the first bipolar transistor 81 is electrically connected to a node RF IN. The first and second bias circuits 83, 84 each include a first end electrically connected to the base of the first NPN bipolar transistor 81 through the first base biasing circuit 261, which can be, for example, a resistor. The first end of the first and second bias circuits 83, 84 is further connected to the base of the second NPN bipolar transistor 82 through the second base biasing circuit 262, which can be, for example, a resistor. The first bias circuit 83 further includes a second end electrically connected to a collector of the first NPN bipolar transistor 81 and to a collector of the second NPN bipolar transistor 82 at a node RF OUT. The second bias circuit 84 further includes a second end electrically connected to a first end of the fourth bias circuit 86 and to a first end of the inductor 89 at a node GND. The fourth bias circuit 86 further includes a second end electrically connected to an emitter of the second NPN bipolar transistor 82. The third bias circuit 85 includes a first end electrically connected to an emitter of the first NPN bipolar transistor 81. The first end of the third bias circuit 85 is further connected to a base of the second NPN bipolar transistor 82 through the DC blocking capacitor 263. The third bias circuit 85 further includes a second end electrically connected to a second of the inductor 89 at a node T1. Additional details of the first and second bipolar transistors 81, 82, the first to fourth bias circuits 81-84, and the inductor 89 can be as described earlier.

The DC blocking capacitor 263 can be used to provide a low impedance path to AC and/or RF signals while blocking or providing a high impedance to DC signals. Thus, at high frequencies the first and second NPN bipolar transistors 81, 82 can operate in a Darlington configuration, while at low frequencies the DC blocking capacitor 263 can provide signal blocking.

Applications

Some of the embodiments described above have provided examples in connection with mobile phones. However, the principles and advantages of the embodiments can be used for any other systems or apparatus that have needs for amplifier systems.

Such amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the word "connected", as generally used herein, refers to two or more elements that may be either directly connected, or connected by way of one or more intermediate elements. Furthermore, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An electronic amplification circuit comprising:
   a first bipolar transistor including an emitter, a base electrically connected to a radio frequency (RF) input node, and a collector electrically connected to an RF output node;
   a second bipolar transistor including an emitter, a base electrically connected to the emitter of the first bipolar transistor, and a collector electrically connected to the RF output node;
   a first bias circuit including a first resistor electrically connected between the base of the first bipolar transistor and the RF output node;
   a second bias circuit including a first diode, a second diode, and a second resistor electrically connected in series between the base of the first bipolar transistor and a power low node;
   an inductor; and
   a third bias circuit electrically connected in series with the inductor between the base of the second bipolar transistor and the power low node.

2. The electronic amplification circuit of claim 1 wherein the inductor is formed at least partly using a bond wire.

3. The electronic amplification circuit of claim 2 wherein a length of the bond wire is configured to control a value of a third order intercept point (IP3) associated with the first and second bipolar transistors.

4. The electronic amplification circuit of claim 2 further comprising a die that includes the first and second bipolar transistors, the bond wire configured to pass over more than half of a length of the die.

5. The electronic amplification circuit of claim 1 wherein the inductor has an inductance ranging between about 0.3 nH and about 4 nH.

6. The electronic amplification circuit of claim 1 further comprising a fourth bias circuit electrically connected between the emitter of the second bipolar transistor and the power low node.

7. The electronic amplification circuit of claim 6 wherein the third bias circuit includes a third diode and a third resistor electrically connected in series with the inductor between the emitter of the first bipolar transistor and the power low node.

8. The electronic amplification circuit of claim 7 wherein the fourth bias circuit includes a fourth resistor electrically connected between the emitter of the second bipolar transistor and the power low node.

9. The electronic amplification circuit of claim 1 further comprising a capacitor electrically connected between the emitter of the first bipolar transistor and a base of the second bipolar transistor.

10. A radio frequency amplification circuit comprising:
    a first field effect transistor (FET) including a source, a gate electrically connected to a radio frequency (RF) input node, and a drain electrically connected to an RF output node;
    a second FET including a source, a gate electrically connected to the source of the first FET, and a drain electrically connected to the RF output node;
    a first bias circuit including a first resistor electrically connected between the gate of the first FET and the RF output node;
    a second bias circuit a first diode, a second diode, and a second resistor electrically connected in series between the gate of the first FET and a power low node;
    an inductor; and
    a third bias circuit electrically connected in series with the inductor between the gate of the second FET and the power low node.

11. The radio frequency amplification circuit of claim 10 wherein the inductor is formed at least partly using a bond wire.

12. The radio frequency amplification circuit of claim 11 wherein a length of the bond wire is configured to control a value of a third order intercept point (IP3) associated with the first and second FETs.

13. The radio frequency amplification circuit of claim 11 further comprising a die that includes the first and second FETs, the bond wire configured to pass over more than half of a length of the die.

14. The radio frequency amplification circuit of claim 10 further comprising a fourth bias circuit electrically connected between the source of the second FET and the power low node.

15. The radio frequency amplification circuit of claim 14 wherein the third bias circuit includes a third diode and a third resistor electrically connected in series with the inductor between the source of the first FET and the power low node.

16. The radio frequency amplification circuit of claim 15 wherein the fourth bias circuit includes a fourth resistor electrically connected between the source of the second FET and the power low node.

17. A packaged radio frequency amplifier comprising:
    a first bipolar transistor including an emitter, a base electrically connected to a radio frequency (RF) input pin, and a collector electrically connected to an RF output pin;

a second bipolar transistor including an emitter, a base electrically connected to the emitter of the first bipolar transistor, and a collector electrically connected to the RF output pin;

a first bias circuit including a first resistor electrically connected between the base of the first bipolar transistor and the RF output pin;

a second bias circuit including a first diode, a second diode, and a second resistor electrically connected in series between the base of the first bipolar transistor and a power low pin;

an inductor implemented at least partly by a bond wire; and a third bias circuit electrically connected in series with the inductor between the base of the second bipolar transistor and the power low pin.

18. The packaged radio frequency amplifier of claim 17 wherein the second bias circuit is electrically connected between the base of the first bipolar transistor and the power low pin by way of a through wafer via.

19. The packaged radio frequency amplifier of claim 18 wherein a length of the bond wire is configured to control a value of a third order intercept point (IP3) associated with the first and second bipolar transistors.

20. The packaged radio frequency amplifier of claim 17 further comprising a fourth bias circuit electrically connected between the emitter of the second bipolar transistor and the power low pin.

* * * * *